(12) United States Patent
Li

(10) Patent No.: US 11,257,889 B2
(45) Date of Patent: Feb. 22, 2022

(54) OLED DISPLAY PANEL HAVING LIGHT SHIELDING LAYER FOR SHIELDING LIGHT EMITTED AT EDGES OF PIXEL-EMITTING REGION, MANUFACTURING METHOD THEREOF, AND OLED DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Xianglong Li, Shenzhen (CN)

( * ) Notice: Subject to any disclaimer, the term of this patent is extended or adjusted under 35 U.S.C. 154(b) by 160 days.

(21) Appl. No.: 16/626,347

(22) PCT Filed: Nov. 14, 2019

(86) PCT No.: PCT/CN2019/118579
§ 371 (c)(1),
(2) Date: Dec. 24, 2019

(87) PCT Pub. No.: WO2021/077500
PCT Pub. Date: Apr. 29, 2021

(65) Prior Publication Data
US 2021/0335966 A1    Oct. 28, 2021

(30) Foreign Application Priority Data
Oct. 22, 2019   (CN) .......................... 201911007724.8

(51) Int. Cl.
*H01L 27/32*  (2006.01)
*H01L 51/52*  (2006.01)
*H01L 51/56*  (2006.01)

(52) U.S. Cl.
CPC ...... *H01L 27/3272* (2013.01); *H01L 27/3246* (2013.01); *H01L 51/5268* (2013.01);
(Continued)

(58) Field of Classification Search
USPC ............................................................ 257/40
See application file for complete search history.

(56) References Cited

U.S. PATENT DOCUMENTS

2009/0231524 A1*  9/2009  Tanaka ................. G02F 1/1339
                                                                  349/110
2015/0187857 A1*  7/2015  Negishi ............... H01L 51/5221
                                                                  257/40
(Continued)

FOREIGN PATENT DOCUMENTS

CN    106206970 A    12/2016
CN    109192758 A     1/2019

*Primary Examiner* — Nduka E Ojeh

(57) ABSTRACT

The present invention provides an organic light-emitting diode (OLED) display panel, a manufacturing method thereof, and a display device. The OLED display panel includes a substrate, an electrode layer, a pixel defining layer, and a light shielding layer. The electrode layer is spaced at intervals on the substrate. The pixel defining layer is placed on the substrate. The pixel defining layer includes dams and a light opening between any two adjacent dams. Each dam includes a dam body and a light shielding layer. A projection of the light shielding layer projected on the substrate is larger than or equal to a projection of the dam body projected on the substrate.

8 Claims, 3 Drawing Sheets

(52) U.S. Cl.
    CPC .......... *H01L 51/5275* (2013.01); *H01L 51/56* (2013.01); *H01L 2227/323* (2013.01)

(56) References Cited

U.S. PATENT DOCUMENTS

| | | |
|---|---|---|
| 2017/0170245 A1 | 6/2017 | Lin |
| 2018/0183012 A1* | 6/2018 | Liu .................... H01L 51/5237 |
| 2019/0067643 A1* | 2/2019 | Zhai .................... H01L 51/5256 |
| 2021/0202624 A1* | 7/2021 | Gong ................ H01L 51/0023 |

* cited by examiner

OLED DISPLAY PANEL HAVING LIGHT SHIELDING LAYER FOR SHIELDING LIGHT EMITTED AT EDGES OF PIXEL-EMITTING REGION, MANUFACTURING METHOD THEREOF, AND OLED DISPLAY DEVICE

1. FIELD OF DISCLOSURE

The present invention relates to organic light-emitting diode (OLED) displays and in particular, to an OLED display panel, a manufacturing method thereof, and an OLED display device.

2. DESCRIPTION OF RELATED ART

An organic functional film layer of an organic light-emitting diode (OLED) device is manufactured by a vacuum thermal deposition method and a solution-casting method. The solution-casting method is further categorized into spin coating, ink-jet printing, screen printing, and etc. The solution-casting method is to apply a solution on a substrate first, and then remove a solvent in the solution by vacuum drying and heat drying by a hot furnace or a hot plate, so that a solid matter in the solution is precipitated on the substrate to form a film.

To be specific, as shown in FIG. 1A and FIG. 1B, a pixel defining layer (PDL) 12 and a bank 13 of a printed substrate 1 are made by inkjet printing with ink 14. Due to ink infiltration or a coffee-ring effect at an edge of the bank 13, film formation quality after the ink 14 is dried is lowered, leading to uneven film thickness and uneven illumination in a light-emitting region, thus compromising a light-emitting effect. In other words, this problem greatly affects pixel illumination uniformity of the conventional printed substrate 1.

Since a hydrophobic substance such as a fluorine-containing compound is formed on a surface of the pixel defining layer 12 on the printed substrate 1, a concave liquid surface 15a is formed in the light-emitting region as shown in FIG. 1A. Since ink infiltration at the edge of the bank 13 may be dealt with by a different approach, it may result in a convex liquid surface 15b as shown in FIG. 1B. In addition, depending on how strong a coffee-ring effect is caused to the ink 14, the concave liquid surface 15a or the convex liquid surface 15b can be formed in the light-emitting region due to unevenness of film formation. Therefore, a convex or concave in-pixel film surface will cause uneven illumination, thereby affecting illumination uniformity in the pixels.

SUMMARY

It is an objective of the present invention to provide an organic light-emitting diode (OLED) display panel, a manufacturing method thereof, and an OLED display device, whereby the present invention shields light emission from a concave/convex surface of a pixel light-emitting region by using a light shielding layer without reducing an area of the pixel light-emitting region, thus achieving uniform illumination of pixels and improving device quality.

Accordingly, the present invention provides an organic light-emitting diode (OLED) display panel, comprising a substrate, an electrode layer, and a pixel defining layer. The electrode layer is spaced at intervals on the substrate. The pixel defining layer is disposed on the substrate. The pixel defining layer comprises forming a plurality of dams and forming a light opening between any two adjacent dams, wherein each dam comprises a dam body and a light shielding layer; wherein a projection of the light shielding layer projected on the substrate is larger than or equal to a projection of the dam body projected on the substrate.

The OLED display panel further comprises an optical film layer disposed over the light opening, wherein the optical film layer is provided with micro-structures on a surface away from the substrate, or the optical film layer is added with scattering particles therein.

The OLED further comprises a glass cover plate disposed on the pixel defining layer, wherein the optical film layer is disposed under the glass cover plate.

The scattering particles are made of silicon dioxide or silicon oxide; the optical film layer is made of polyacrylate, acryl resin, or melamine resin; and a refractive index of the scattering particles is different from a refractive index of the optical film layer.

The light shielding layer is a mask, a black matrix, or a cover plate having a black matrix, the electrode layer is an anode, and a size of the light shielding opening is smaller than a size of the light opening and ranges from one micrometer to eight micrometers.

The present invention provides a manufacturing method of an organic light emitting (OLED) display panel, comprising following steps:

S10: providing a substrate;

S20: forming an electrode layer spaced at intervals on the substrate; and

S30: forming a pixel defining layer on the substrate, wherein the pixel defining layer comprises forming a plurality of dams and forming a light opening between any two adjacent dams, wherein each dam comprises a dam body and a light shielding layer, and a projection of the light shielding layer projected on the substrate is larger than or equal to a projection of the dam body projected on the substrate.

After step S30, the manufacturing method of the OLED display panel further comprises forming an optical film layer over the light opening, wherein the optical film layer is provided with micro-structures on a surface away from the substrate, or the optical film layer is added with scattering particles therein.

An optical film layer is an anti-reflection film consisting of a high refractive index material and a low refractive index material alternately stacked on each other, or is a viewing angle improving film with the micro-structures formed on one side by a roughening treatment.

In step S30, the light shielding layer is applied onto the dam bodies of the pixel defining layer by a photolithography process, and then patterned by an exposure/development process.

The present invention further provides an organic light-emitting diode (OLED) display device. The OLED display device comprises the OLED display panel in the above embodiments.

The OLED display device further comprises an optical film layer disposed over the light opening, wherein the optical film layer is provided with micro-structures on a surface away from the substrate, or the optical film layer is added with scattering particles therein.

The OLED display device further comprises a glass cover plate disposed on the pixel defining layer, wherein the optical film layer is disposed under the glass cover plate.

The scattering particles are made of silicon dioxide or silicon oxide; the optical film layer is made of polyacrylate, acryl resin or melamine resin; and a refractive index of the scattering particles is different from a refractive index of the optical film layer.

The light shielding layer is a mask, a black matrix, or a cover plate having a black matrix, and the electrode layer is an anode.

A light shielding opening is defined between any two adjacent light shielding layers, and a size of the light shielding layer is smaller than a size of the light opening and ranges from one micrometer to eight micrometers.

Advantages of the present invention: The present invention also has the following functions. The present invention utilizes the light shielding layer for shielding non-uniform illumination and a color shift caused by unevenness of film formation at an edge light-emitting region, thereby achieving uniform illumination of pixels and product quality. Furthermore, in order to further improve color uniformity and angles of view, an optical film layer is disposed at a light shielding opening.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

"Embodiment" in the following description means that specific features, structures or characteristics described in connection with the embodiment may be included in at least one embodiment of the present invention. The same terms appearing in different places in the specification are not necessarily limited to the same embodiment, but should be understood as an independent or alternative embodiment to other embodiments. Based on the technical solutions disclosed in the embodiments of the present invention, those skilled in the art can understand other combinations or modifications in accordance with the embodiments of the present invention.

Figure 1A:
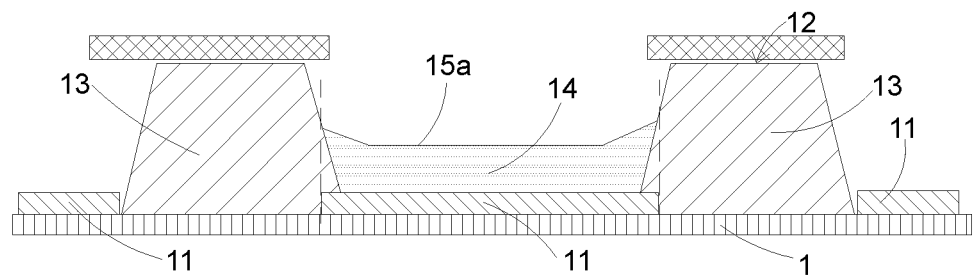
FIG. 1A is a schematic cross-sectional view illustrating a conventional organic light-emitting diode (OLED) display panel.
Figure 1B:
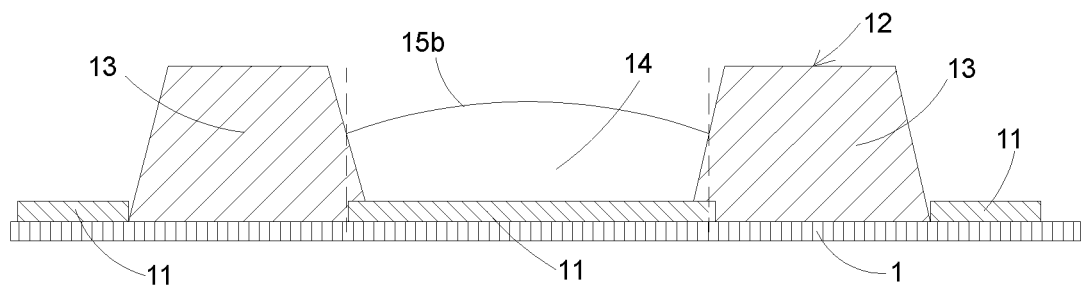
FIG. 1B is another cross-sectional view illustrating the conventional OLED display panel.
Figure 2:
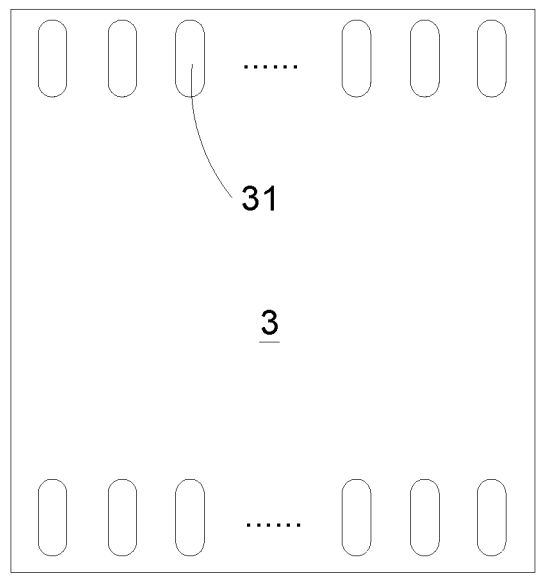
FIG. 2 is a planar view illustrating a light shielding layer of an OLED display panel according to the present invention.
Figure 3:
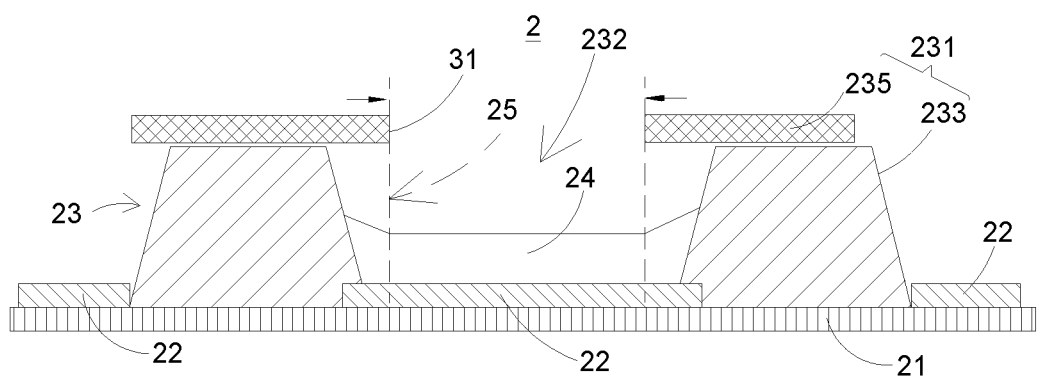
FIG. 3 is a cross-sectional view illustrating the OLED display panel according to the present invention.

Please refer to FIGS. 2 and 3. FIG. 2 is a planar view illustrating a light shielding layer of an organic light-emitting diode (OLED) display panel. FIG. 3 is a cross-sectional view illustrating the OLED display panel according to the present invention. As shown in the drawings, the present invention provides an OLED display panel 2. The OLED display panel 2 comprises a substrate 21, an electrode layer 22, and a pixel defining layer 23. The OLED display panel 2 is preferably used in the field of OLED displays. In alternative embodiments, the OLED display panel 2 can also be used in display technologies in which pixels have uneven brightness/chromaticity in an edge region and a central region such as quantum dots light-emitting diode (QLED) display technology, micro light-emitting diode (Micro-LED) display technology, or QD-OLED (quantum dots OLED) technology which combines OLED and QD; however, the present invention is not limited in this regard.

The electrode layer 22 is spaced at intervals on the substrate 21. The pixel defining layer 23 is disposed on the substrate 21. The pixel defining layer 23 comprises a plurality of dams 231 and a light opening 232 between any two adjacent dams 231. Each dam 231 comprises a dam body 233 and a light shielding layer 235. A projection of the light shielding layer 235 projected on the substrate 21 is larger than or equal to a projection of the dam body 233 projected on the substrate 21. In other words, the light opening 232 between two adjacent light shielding layers 235 further comprises a light shielding opening 31, and the light shielding opening 31 is smaller than the light opening 232.

Specifically, in the embodiment shown in FIG. 3, the substrate 21 may be selected from common substrates in this field and includes, but is not limited to, a thin film transistor (TFT) substrate. The light shielding layer 235 is preferably a mask. In alternative embodiments, the light shielding layer 235 is a black matrix, a glass cover plate having a black matrix, or other suitable material. The light shielding layer 235 is directly disposed on each of the dam bodies 233 of the pixel defining layer 23, or disposed on a cover plate (not illustrated) and then aligned and attached to the panel having pixels (not illustrated) to shield non-uniform illumination at edges of the pixels, thereby improving uniform illumination of the pixels. The electrode layer 22 is an anode and can be made of a conventional pixel electrode material, such as indium tin oxide (ITO), indium tin oxide/silver/indium tin oxide (ITO/Ag/ITO), or graphene. A size of the light shielding opening 31 is smaller than a size of the light opening 232 and ranges from one micrometer to eight micrometers. A pixel light-emitting region 25 is defined by the light opening 232 between any two adjacent dams 231 and the electrode layer 22 disposed in the light opening 232. Therefore, the present embodiment shields non-uniform illumination from a concave/convex surface of the pixel light-emitting region 25 by means of the light shielding layer 235 without reducing an area of the pixel light-emitting region 25, thereby improving uniform illumination of the pixels and device quality.

Figure 4:
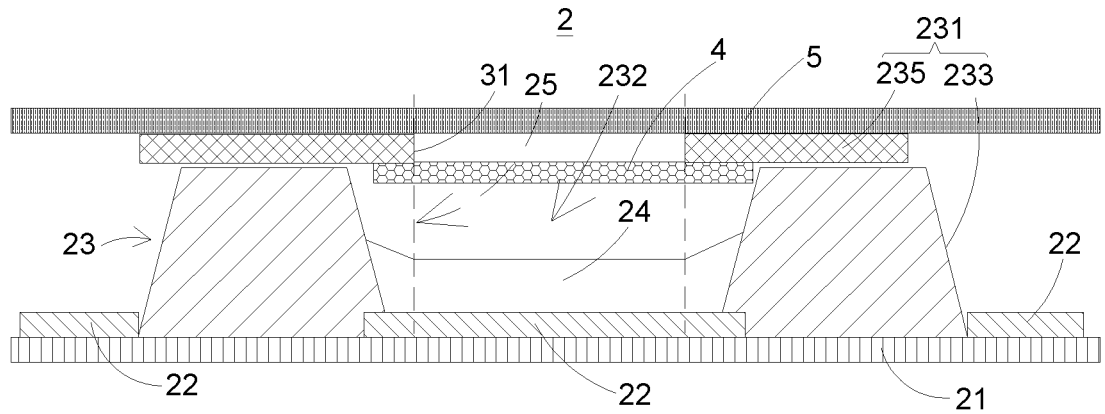
FIG. 4 is another cross-sectional view illustrating the OLED display panel according to the present invention.

Referring to FIG. 4, the OLED display panel further comprises an optical film layer 4 disposed over the light opening 232 and a glass cover plate 5 disposed on the pixel defining layer 23. An edge of the optical film layer 4 is disposed between an edge of the light shielding opening 31 and an edge of the light opening 232. The optical film layer 4 is attached to a lower surface of the light shielding layer 235 or upper surfaces of two adjacent dams 231. In an alternative embodiment, the optical film layer 4 can be disposed on a surface of the glass cover plate 5 at one side; configuration may vary as required.

It is preferable that the dam 231 is made of epoxy and is added with a dye or a pigment in the light shielding layer 235. In order to achieve uniform illumination of the pixels of the present embodiment, and to improve colors of light and angles of view. A surface (not illustrated) of the optical film layer 4 of the present embodiment away from the substrate 21 (not illustrated) is provided with micro-structures (not illustrated) by a roughening treatment, so special micro-structures such as a micro-lenses or micro-prisms are formed to improve the angles of view. In an alternative embodiment, the optical film layer 4 is added with scattering particles (not illustrated) inside to refract or scatter light. The scattering particles are made of silicon dioxide or silicon oxide. The optical film layer is made of polyacrylate, acryl resin, or melamine resin. A refractive index of the scattering particles is different from a refractive index of the optical film layer 4.

According to one embodiment of the present invention, the optical film layer 4 may also be an anti-reflection film consisting of a high refractive index material and a low refractive index material alternately stacked on each other. The high refractive index material is, for example, titanium oxide ($TiO_2$), chromium oxide ($Cr_2O_3$) or a high polymer material with a mixture thereof. The low refractive index material is silicon dioxide ($SiO_2$) or silicon oxide ($SiO_x$). A hollow portion (i.e., the light shielding opening 31) in the light shielding layer 235 can collaborate with the optical film layer 4 to improve color uniformity of light, angles of view, and etc.

Figure 5:
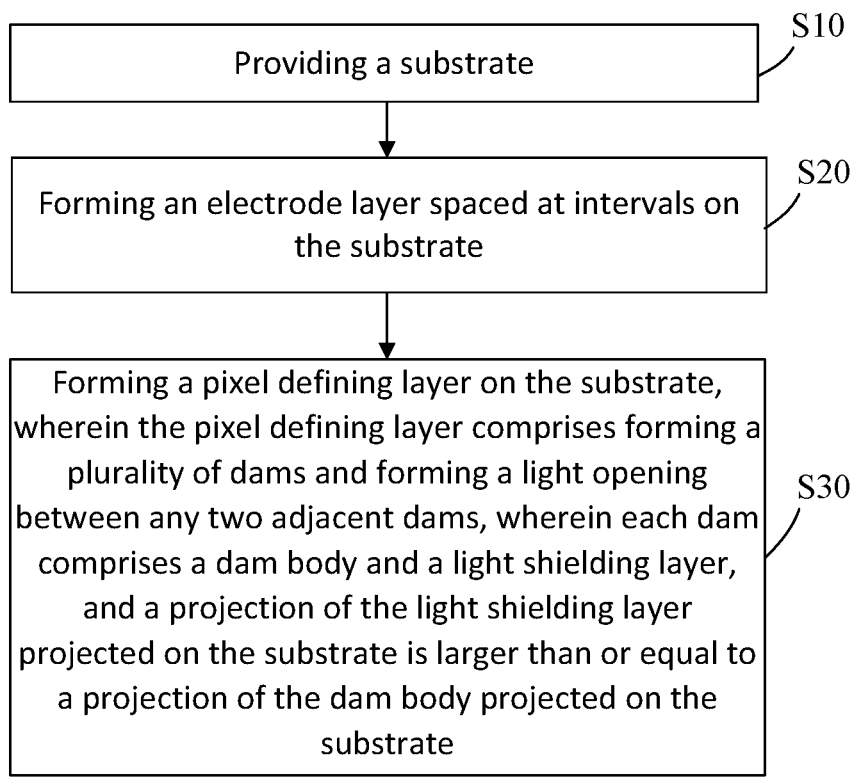
FIG. 5 is a process flow diagram illustrating a manufacturing method of the OLED display panel according to the present invention.

Referring to FIG. 5, the present invention provides a manufacturing method of an organic light emitting (OLED) display panel 2, comprising following steps:

Step S10: proving a substrate 21;

Step S20: forming an electrode layer 22 spaced at intervals on the substrate 21;

Step S30: forming a pixel defining layer 23 on the substrate 21, wherein the pixel defining layer 23 comprises forming a plurality of dams 231 and forming a light opening 232 between any two adjacent dams 231, wherein each dam 231 comprises a dam body 233 and a light shielding layer 235, and a projection of the light shielding layer 235 projected on the substrate 21 is larger than or equal to a projection of the dam body 233 projected on the substrate 21. In other words, a light shielding opening 31 is defined between the light shielding layers 235 and arranged correspondingly to the light openings 232. A size of the light shielding opening 31 is smaller than a size of the light opening 232 and ranges from one micrometer to eight micrometers.

The substrate 21 in step S10 is selected from conventional substrates in this field including, but not limited to, a thin film transistor (TFT) substrate. The electrode layer 22 in step S20 may be formed by vacuum deposition, sputtering, physical vapor deposition (PVD), or chemical vapor deposition (CVD). Material of the electrode layer 22 comprises one of metal oxide, metal, or a combined material (e.g., ITO or ITO/Ag/ITO), or graphene.

After step S30, an OLED device layer (not illustrated) is evaporated and deposited on the light shielding layer 235, and an encapsulation layer (not illustrated) is formed on the OLED device layer. The OLED device layer includes a hole injection layer (HIL), a hole transport layer (HTL), a light emitting layer (EML), an electron transport layer (ETL), an electron injection layer (EIL), and a cathode. The encapsulation layer is formed by a sealant (Dam), thin film encapsulation (TFE), a desiccant filling, face sealing, or laser sealing using glass powder. Material of the encapsulation layer can comprise an organic material and/or an inorganic material.

After step 30, an optical film layer 4 is formed over the light opening 232. An edge of the optical film layer 4 is formed between an edge of the light shielding opening 31 and an edge of the light opening 232. The optical film layer 4 is disposed on a lower surface of the light shielding layer 235 or upper surfaces of two adjacent dam bodies 231. The dam 231 is made of epoxy and added with a dye or a pigment in the light shielding layer 235. The optical film layer 4 is an anti-reflection film consisting of a high refractive index material and a low refractive index material alternately stacked with each other, or is a viewing angle improving film having micro-structures formed on one side by a roughening treatment, or is a viewing angle improving film composed of the optical film layer 4 added with scattering particles, thereby improving color uniformity of light and angles of views.

The scattering particles are made of silicon dioxide or silicon oxide. The optical film layer 4 is made of polyacrylate, acryl resin or melamine resin. A refractive index of the scattering particles is different from a refractive index of the optical film layer. Specifically, the anti-reflective optical film layer 4 is generally formed by evaporation, sputtering, vapor deposition, or coating, wherein the preferable method is vapor deposition or coating. The optical film layer 4 for shielding light and the functional film for improving the angles of view or color of light are formed by a photolithography process or a development process.

It should be noted that, in step 30, the light shielding layer 235 is disposed on each of the dam bodies 233 of the pixel defining layer 23 by a photolithography process, and then patterned by an exposure/development process. The light shielding layer 235 is applied by inkjet printing, spreading, printing, spin coating, dip coating, or pulling, wherein inkjet printing is preferable. In alternative embodiments, the light shielding layer 235 can be formed by means of vapor deposition, sputtering, or vapor deposition; methods may change as needed.

The light shielding film 235 of the pixel defining layer 23 is formed by using a mask. However, in alternative embodiments, the light shielding layer 235 may also be a conventional black matrix material or a glass cover plate having a black matrix material. In the present embodiment, the OLED display panel 2 is manufactured by a solution processing technology and a printing process, wherein non-uniform illumination at edges of pixels is shielded by the light shielding layer 235, thereby solving a problem of uneven illumination of the pixels caused by uneven film thickness in a conventional solution processing technology, thus achieving uniform illumination of the pixel substrate. The manufacturing method can also be used in a quantum dots light-emitting diode (QLED) display panel or QD-OLED display panel processed by a solution; and the present invention is not limited in this regard.

The present invention also provides an OLED display device comprising the OLED display panel 2 described in the above embodiment. Other structures related to the OLED display device are about conventional techniques, so a detailed description thereof is omitted herein for brevity.

In summary, although the present invention has been described above in connection with specific embodiments, it will be appreciated that many alternatives, modifications, and variations are apparent to those skilled in the art. All such alternatives, modifications, and variations should be deemed to be within the protection scope of the present invention defined by the appended

What is claimed is:

1. An organic light-emitting diode (OLED) display panel, comprising:
   a substrate;
   an electrode layer spaced at intervals on the substrate;
   a pixel defining layer disposed on the substrate, the pixel defining layer comprising forming a plurality of dams and forming a light opening between any two adjacent dams, wherein each dam comprises a dam body and a light shielding layer disposed on the dam body;

an optical film layer disposed in each light opening, wherein the optical film layer is provided with microstructures on a surface away from the substrate, or the optical film layer is provided with scattering particles, the scattering particles made of silicon dioxide or silicon oxide, the optical film layer provided with the scattering particles is made of polyacrylate, acryl resin, or melamine resin, and a refractive index of the scattering particles is different from a refractive index of the optical film layer; and a glass cover plate disposed on the light shielding layers, wherein each optical film layer is disposed under the glass cover plate and attached to lower surfaces of the corresponding two adjacent light shielding layers or upper surfaces of the corresponding two adjacent dam bodies;

wherein a projection of each light shielding layer projected on the substrate is larger than or equal to a projection of the corresponding dam body projected on the substrate, a light shielding opening is defined between any two adjacent light shielding layers, and a size of each light shielding opening is smaller than a size of the corresponding light opening.

2. The OLED display panel according to claim 1, wherein the light shielding layer is a mask, a black matrix, or a cover plate having a black matrix, the electrode layer is an anode, and the size of the light shielding opening ranges from one micrometer to eight micrometers.

3. An organic light-emitting diode (OLED) display device, comprising the OLED display panel of claim 1.

4. The OLED display device according to claim 3, wherein the light shielding layer is a mask, a black matrix, or a cover plate having a black matrix, and the electrode layer is an anode.

5. The OLED display device according to claim 3, wherein a light shielding opening is defined between any two adjacent light shielding layers, and a size of the light shielding layer is smaller than a size of the light opening and ranges from one micrometer to eight micrometers.

6. A manufacturing method of an organic light emitting (OLED) display panel, comprising following steps:

providing a substrate;

forming an electrode layer spaced at intervals on the substrate;

forming a pixel defining layer on the substrate, wherein the pixel defining layer comprises forming a plurality of dams and forming a light opening between any two adjacent dams, wherein each dam comprises a dam body and a light shielding layer formed on the dam body, and a projection of each light shielding layer projected on the substrate is larger than or equal to a projection of the corresponding dam body projected on the substrate;

forming an optical film layer in each light opening, wherein the optical film layer is provided with microstructures on a surface away from the substrate, or the optical film layer is provided with scattering particles, the scattering particles made of silicon dioxide or silicon oxide, the optical film layer provided with the scattering particles is made of polyacrylate, acryl resin, or melamine resin, and a refractive index of the scattering particles is different from a refractive index of the optical film layer; and providing a glass cover plate formed on the light shielding layers, wherein each optical film layer is arranged at lower surfaces of the corresponding two adjacent light shielding layers or upper surfaces of the corresponding two adjacent dam bodies, a light shielding opening is defined between any two adjacent light shielding layers, and a size of each light shielding opening is smaller than a size of the corresponding light opening.

7. The manufacturing method of the OLED display panel according to claim 6, wherein each optical film layer provided with the scattering particles is an anti-reflection film consisting of a high refractive index material and a low refractive index material alternately stacked on each other, and each optical film layer provided with the micro-structures is a viewing angle improving film with the microstructures formed on one side by a roughening treatment.

8. The manufacturing method of the OLED display panel according to claim 6, wherein in step S30, the light shielding layer is applied onto the dam bodies of the pixel defining layer by a photolithography process, and then patterned by an exposure/development process.

* * * * *